(12) United States Patent
Chen et al.

(10) Patent No.: US 8,134,399 B2
(45) Date of Patent: Mar. 13, 2012

(54) SIGNAL TRANSFORMER

(75) Inventors: Ji-Ming Chen, Wuxi (CN); Huan-Wen Chien, Taipei County (TW)

(73) Assignee: Green Solution Technology Co., Ltd., New Taipei (TW)

( * ) Notice: Subject to any disclaimer, the term of this patent is extended or adjusted under 35 U.S.C. 154(b) by 485 days.

(21) Appl. No.: 12/427,762

(22) Filed: Apr. 22, 2009

(65) Prior Publication Data
US 2010/0237849 A1    Sep. 23, 2010

(30) Foreign Application Priority Data

Mar. 20, 2009   (TW) ................................ 98109227 A

(51) Int. Cl.
*H03K 5/08*    (2006.01)

(52) U.S. Cl. .............................. 327/333; 326/80; 326/81
(58) Field of Classification Search .................. 327/333; 326/80, 81
See application file for complete search history.

(56) References Cited

U.S. PATENT DOCUMENTS 7,619,460 B2 * 11/2009 Mei et al. ...................... 327/333
* cited by examiner

*Primary Examiner* — Kenneth B. Wells
(74) *Attorney, Agent, or Firm* — Jianq Chyun IP Office

(57) ABSTRACT

A fast current generating element in a current generating unit, used by the present invention, provides a large current for accelerating the switching of transistor switches when the transistor switches are switched. The fast current generating element includes a capacitor to provide a large differential current when a voltage level transiently changes during the switching of the transistor switches. Therefore, a transient response time of a signal transformer is shortened.

11 Claims, 10 Drawing Sheets

US 8,134,399 B2

SIGNAL TRANSFORMER

CROSS-REFERENCE TO RELATED APPLICATION

This application claims the priority benefit of Taiwan application serial no. 98109227, filed on Mar. 20, 2009. The entirety of the above-mentioned patent application is hereby incorporated by reference herein and made a part of specification.

BACKGROUND OF THE INVENTION

1. Field of the Invention

The present application relates to a signal transformer, and more particularly to a signal transformer capable of regulating a signal level.

2. Description of Related Art

Please refer to FIG. 1A which is a schematic circuit diagram of a conventional signal transformer for regulating a level of an input signal to a suitable level and then outputting the regulated input signal. The signal transformer includes an inverter IN, N-type transistor switches M1, M2, M5, and M6, and P-type transistor switches M3, M4, M7, and M8. The inverter IN is connected to a ground reference potential $V_{SS}$ and a low driving voltage reference potential $V_{DD}$, and outputs an input signal $T_{IN}$ inversely. Sources of the N-type transistor switches M1 and M2 are connected to the ground reference potential $V_{SS}$, and drains thereof are respectively connected to sources of the N-type transistor switches M5 and M6. Gates of the N-type transistor switches M5 and M6 receive a low reference potential $V_{REFL}$, and drains thereof are respectively connected to sources of the P-type transistor switches M7 and M8. Gates of the P-type transistor switches M7 and M8 receive a high reference potential $V_{REFH}$, and sources thereof are respectively connected to drains of the P-type transistor switches M3 and M4. Sources of the P-type transistor switches M3 and M4 are connected to a high driving voltage reference potential $HV_{DD}$. A gate of the P-type transistor switch M3 is connected to the drain of the P-type transistor switch M4, and a gate of the P-type transistor switch M4 is connected to the drain of the P-type transistor switch M3.

The input signal $T_{IN}$ is input to a gate of the N-type transistor switch M1, and the input signal $T_{IN}$ is also input to a gate of the N-type transistor switch M2 after it is inverted by the inverter IN. Please refer to FIG. 1B which shows signal waveforms of the signal transformer depicted in FIG. 1A. While the input signal $T_{IN}$ is converted from a low level to a high level, the N-type transistor switch M1 changes from cut-off to conducting, and the N-type transistor switch M2 changes from conducting to cut-off, so that a drain potential CLSO1 of the N-type transistor switch M1 is converted from the high level to the low level (i.e. the ground reference potential $V_{SS}$), and a drain potential CLSO2 of the N-type transistor switch M2 is converted from the low level to the high level. Since the transistor switches have parasitic capacitors, a delay time "Delay" exists from the beginning of converting the drain potential CLSO1 of the N-type transistor switch M1 to a steady state as well as the drain potential CLSO2 of the N-type transistor switch M2. Since a gate potential of the N-type transistor switch M6 is equal to the low reference potential $V_{REFL}$, the drain potential CLSO2 of the N-type transistor switch M2 in the steady state is $V_{REFL}-V_{tn}$, wherein $V_{tn}$ ($V_{tn}>0$) is a threshold voltage of the N-type transistor switch M6. Meanwhile, while the drain potential CLSO1 of the N-type transistor switch M1 falls from the high level to the low level, a drain potential CLSO3 of the P-type transistor switch M3 also falls, so that the P-type transistor switch M4 is conducted. Accordingly, a drain potential CLSO4 of the P-type transistor switch M4 reaches to a high driving voltage reference potential $HV_{DD}$, and causes the P-type transistor switch M3 to be cut-off, such that the drain potential CLSO3 of the P-type transistor switch M3 falls to and steadies in $HV_{DD}-V_{REFH}+V_{tp}$, wherein $V_{tp}$ (Vtp>0) is a threshold voltage of the P-type transistor switch M7. Similarly, due to the parasitic capacitors of the transistor switches, the delay time "Delay" exists when the drain potential CLSO3 of the P-type transistor switch M3 and the drain potential CLSO4 of the P-type transistor switch M4 are converted to be in the steady state. While the input signal $T_{IN}$ is converted from the high level to the low level, the potentials CLSO2 and CLSO4 are converted from the high level to the low level after the delay time "Delay", and the potentials CLSO1 and CLSO3 are converted from the low level to the high level after the delay time "Delay". Through the above-described conversions, the input signal, which level is between the low driving voltage reference potential $V_{DD}$ and the ground reference potential $V_{SS}$, is converted to two opposite signals CLSO3 and CLSO4, which levels are between the high driving voltage reference potential $HV_{DD}$ and ($HV_{DD}-V_{REFH}$).

Due to an obvious transient delay time is generated during the signal conversion process of the conventional signal transformer, such that the performance of the conventional signal transformer is affected. Besides, the longer is the transient delay time, the more is the switching power loss.

SUMMARY OF THE INVENTION

Accordingly, since a transient response time of the signal transformer is excessively long according to the related art, the circuit performance is affected. In exemplary embodiments of the present invention, a large current is applied to accelerate a switching rate during switching process, and the transient response time is reduced, such that the problem of the excessive transient response time can be prevented.

One exemplary embodiment of the present invention provides a signal transformer including two input elements and an output unit for transforming a level of signal. Each of the input elements includes an input unit, an output trigger unit, and a current generating unit. The input unit is coupled to a first common level and a second common level and receives an input signal, thereby generating a current generating signal and a trigger signal. A level of the input signal is between the first common level and the second common level. The output trigger unit is coupled to a third common level and the input unit and generates an output trigger signal according to the trigger signal. The current generating unit is coupled to the input unit and the output trigger unit and includes a fast current generating element. The fast current generating element generates a current pulse signal according to the current generating signal for shortening a transient response time of the output trigger signal generated by the output trigger unit. The output unit is coupled to the third common level and a fourth common level and generates two output signals with opposite phases according to the two output trigger signals of the two output trigger units, wherein levels of the two output signals are between the third common level and the fourth common level.

In an embodiment of the present invention, the above-described fast current generating element may include a capacitor coupled to one of the first common level and the second common level and coupled to the corresponding input unit. While the input signal level is converted, the capacitor of the fast current generating element provides a differential current to accelerate the switching rate of the two input elements and the transistor switches in the output unit, so that the transient response of the circuit is improved.

It is to be understood that both the foregoing general description and the following detailed description are exemplary, and are intended to provide further explanation of the invention as claimed. In order to make the features and advantages of the present invention comprehensible, exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate exemplary embodiments of the present invention, and together with the description, serve to explain the principles of the invention.

DESCRIPTION OF EMBODIMENTS

Figure 1A:
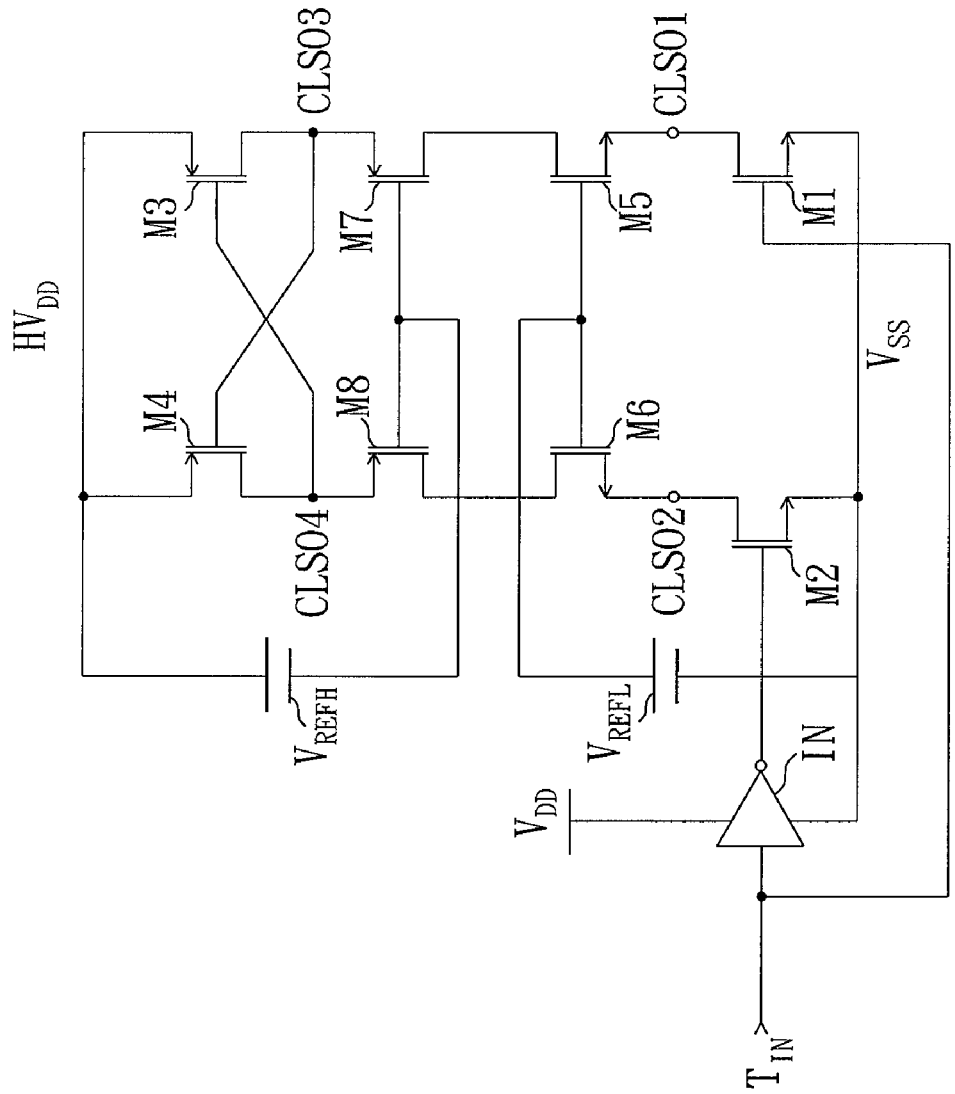
FIG. 1A is a schematic circuit diagram of a conventional signal transformer for regulating a level of an input signal to a suitable level and then outputting the regulated input signal.
Figure 1B:
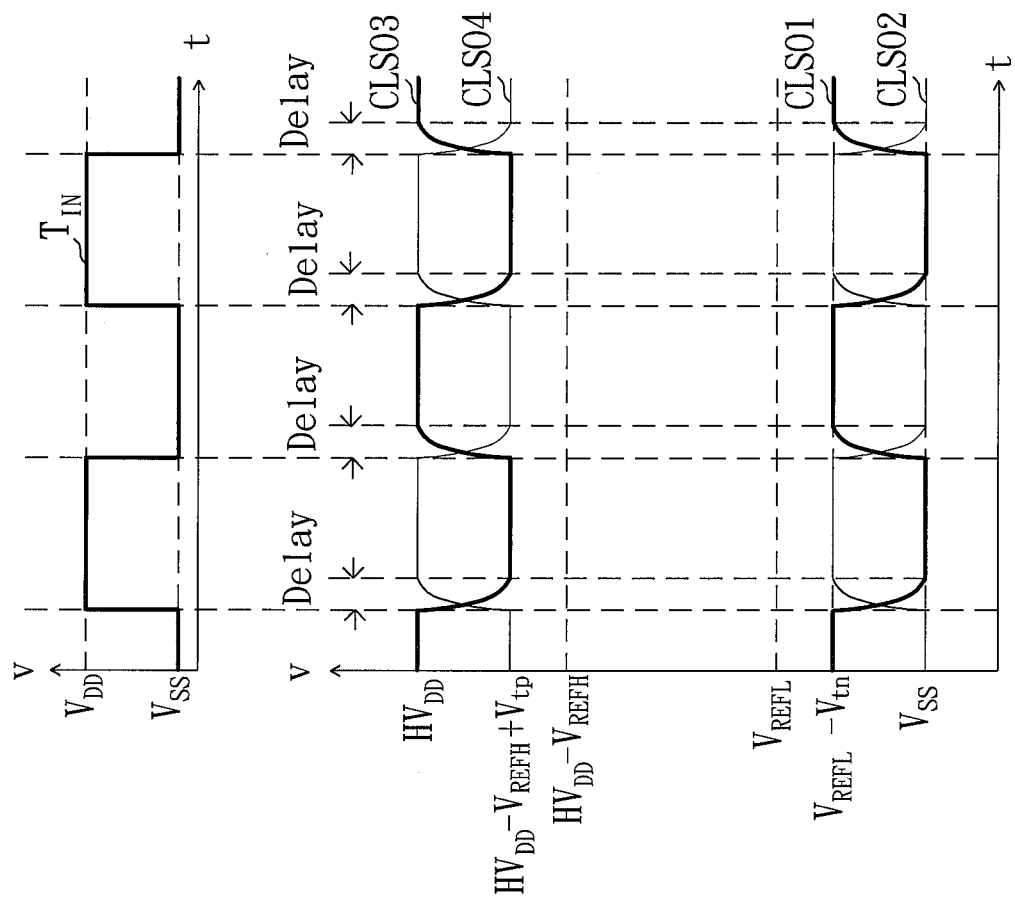
FIG. 1B shows signal waveforms of the signal transformer depicted in FIG. 1A.
Figure 2:
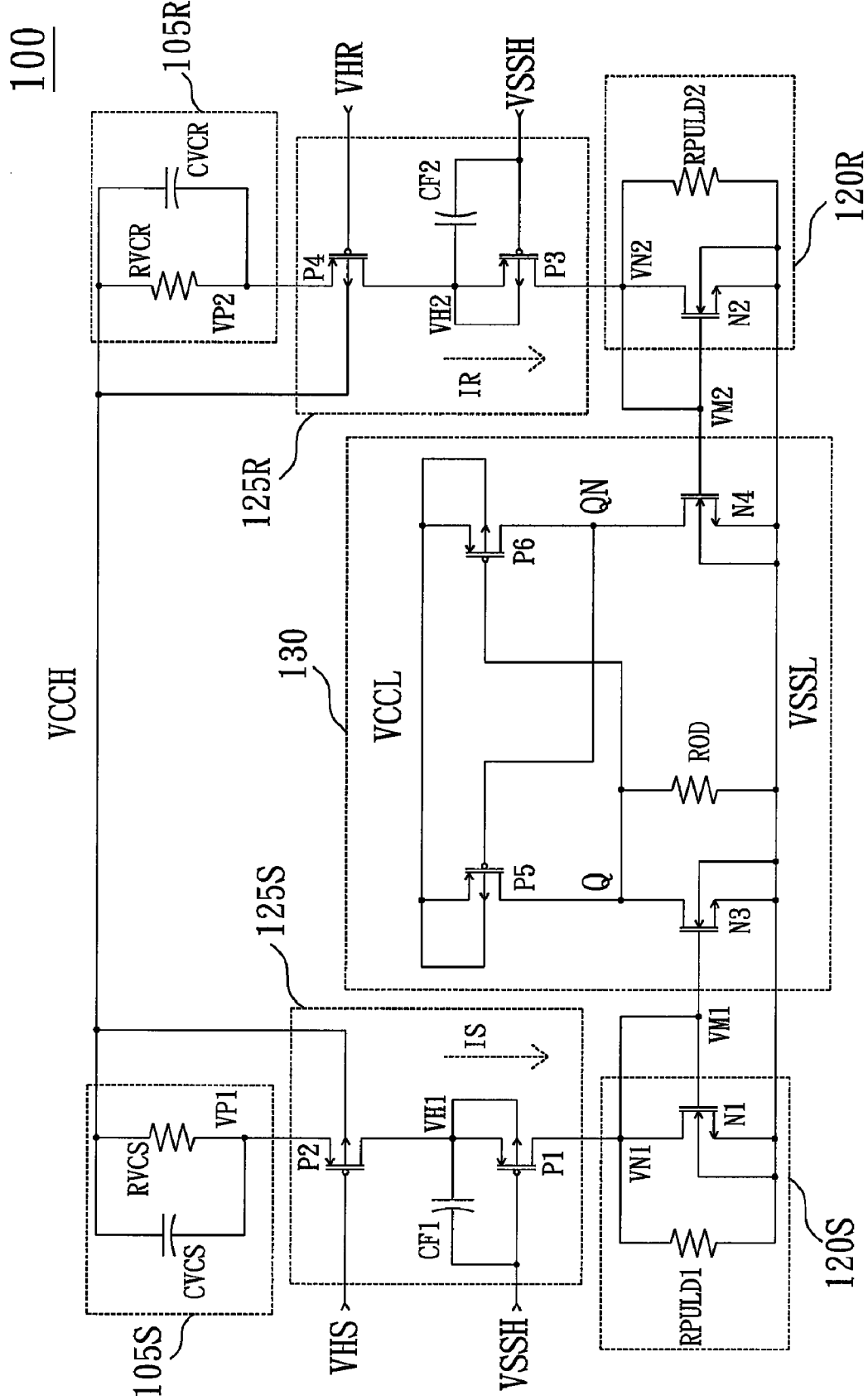
FIG. 2 is a schematic circuit diagram of a signal transformer according to one exemplary embodiment of the present invention.

Please refer to FIG. 2 which is a schematic circuit diagram of a signal transformer according to one exemplary embodiment of the present invention. The signal transformer 100 is used to transform a level of signal and includes a first input element, a second input element, and an output unit 130. The first input element and the second input element are coupled to a first common level VCCH and a third common level VSSL, and the output unit 130 is coupled to the third common level VSSL and a fourth common level VCCL. The first input element includes a first input unit 125S, a first output trigger unit 120S, and a first current generating unit 105S. The second input element includes a second input unit 125R, a second output trigger unit 120R, and a second current generating unit 105R.

The first input unit 125S and the second input unit 125R are coupled to the first common level VCCH and a second common level VSSH. The first input unit 125S includes a first P-type transistor switch P2 and a second P-type transistor switch P1 which are connected in series. That is, the drain of the first P-type transistor switch P2 is coupled to the source of the second P-type transistor switch P1. The gate of the first P-type transistor switch P2 receives a first input signal VHS, and the source thereof is coupled to the first current generating unit 105S. The gate of the second P-type transistor switch P1 is coupled to the second common level VSSH, and the drain thereof is coupled to the first output trigger unit 120S. The second input unit 125R includes a third P-type transistor switch P4 and a fourth P-type transistor switch P3 which are connected in series. That is, the drain of the third P-type transistor switch P4 is coupled to the source of the fourth P-type transistor switch P3. The gate of the third P-type transistor switch P4 receives a second input signal VHR, and the source thereof is coupled to the second current generating unit 105R. The gate of the fourth P-type transistor switch P3 is coupled to the second common level VSSH, and the drain thereof is coupled to the second output trigger unit 120R. The first input unit 125S and the second input unit 125R respectively generate a first current generating signal VP1, a first trigger signal VN1, a second current generating signal VP2, and a second trigger signal VN2 according to the first input signal VHS and the second input signal VHR. Here, the levels of the first input signal VHS and the second input signal VHR are between the first common level VCCH and the second common level VSSH.

Besides, in order to filter out high-frequency oscillating noises generated from the transistor switches in the first input element and the second input element while the transistor switches are switching, filter capacitors can be disposed between any two terminals of the second P-type transistor switch P1 and between any two terminals of the fourth P-type transistor switch P3. For example, as shown in the drawings, a first filter capacitor CF1 and a second filter capacitor CF2 are respectively disposed between the source and the gate of the second P-type transistor switch P1 and between the source and the gate of the fourth P-type transistor switch P3 to filter out high-frequency noises caused by the switching action and prevent the circuit from being affected by the noises. In addition, since the gates of the second P-type transistor switch P1 and the fourth P-type transistor switch P3 are coupled to the second common level VSSH, the first input element and the second input element can rapidly follow the changing of the second common level VSSH, so that an erroneous action of the second P-type transistor switch P1 and the fourth P-type transistor switch P3 due to any variation of the second common level VSSH is avoided.

The first output trigger unit 120S and the second output trigger unit 120R are coupled to the third common level VSSL, and are respectively coupled to the first input unit 125S and the second input unit 125R. The first output trigger unit 120S includes a first resistor RPULD1 and a first N-type transistor switch N1 which are connected in parallel. The drain of the first N-type transistor switch N1 is coupled to the drain of the second P-type transistor switch P1 in the first input unit 125S, and the gate thereof is coupled to the output unit 130 and the source thereof is coupled to the third common level VSSL. One terminal of the first resistor RPULD1 is coupled to the drain of the first N-type transistor switch N1, and the other terminal thereof is coupled to the source of the first N-type transistor switch N1. The second output trigger unit 120R includes a second resistor RPULD2 and a second N-type transistor switch N2 which are connected in parallel. The drain of the second N-type transistor switch N2 is coupled to the drain of the fourth P-type transistor switch P3 in the second input unit 125R, and the gate thereof is coupled to the output unit 130 and the source thereof is coupled to the third common level VSSL. One terminal of the second resistor RPULD2 is coupled to the drain of the second N-type transistor switch N2, and the other terminal thereof is coupled to the source of the second N-type transistor switch N2. Through the first resistor RPULD1 and the second resistor RPULD2, while the first N-type transistor switch N1 and the second N-type transistor switch N2 are cut-off, the drains can be prevented from being in a floating state, and further, possible errors of the circuit are avoided. The first output trigger unit 120S and the second output trigger unit 120R respectively generate a first output trigger signal VM1 and a second output trigger signal VM2 to the output unit 130 according to the first trigger signal VN1 and the second trigger signal VN2.

The first current generating unit 105S and the second current generating unit 105R are respectively coupled to the first input unit 125S and the second input unit 125R. Besides, through the first input unit 125S and the second input unit 125R, the first current generating unit 105S and the second current generating unit 105R are respectively coupled to the first output trigger unit 120S and the second output trigger unit 120R. The first current generating unit 105S includes a first current resistor RVCS and a first current capacitor CVCS which are connected in parallel. One terminal of the first current resistor RVCS is coupled to the first common level VCCH, and the other terminal thereof is coupled to the first input unit 125S. Here, the first current capacitor CVCS acts as a fast current generating element and generates a current pulse signal according to the first current generating signal VP1. That is, while the transistor switches in the first input element are switched, the first current capacitor CVCS provides a sufficient instant current to shorten a transient response time of the first output trigger unit 120S generating the first output trigger signal VM1, and so the switching rate thereof is accelerated. The second current generating unit 105R includes a second current resistor RVCR and a second current capacitor CVCR which are connected in parallel. One terminal of the second current resistor RVCR is coupled to the first common level VCCH, and the other terminal thereof is coupled to the second input unit 125R. Here, the second current capacitor CVCR also serves as a fast current generating element and generates a current pulse signal according to the second current generating signal VP2 to shorten a transient response time of the second output trigger unit 120R generating the second output trigger signal VM2. A period of the transient response time can also be regulated by adjusting the first current capacitor CVCS, the first current resistor RVCS, the second current capacitor CVCR, and the second current resistor RVCR.

The output unit 130 includes a fifth P-type transistor switch P5 and a third N-type transistor switch N3 which are connected in series, a sixth P-type transistor switch P6 and a fourth N-type transistor switch N4 which are connected in series, and an initial resistor ROD. The source of the third N-type transistor switch N3 is coupled to the third common level VSSL, the gate thereof is coupled to the first output trigger signal VM1, and the drain thereof is coupled to the drain of the fifth P-type transistor switch P5, so that the output unit 130 generates a first output signal Q. The source of the fourth N-type transistor switch N4 is coupled to the third common level VSSL, the gate thereof is coupled to the second output trigger signal VM2, and the drain thereof is coupled to the drain of the sixth P-type transistor switch P6, so that the output unit 130 generates a second output signal QN. The gate of the fifth P-type transistor switch P5 is coupled to the second output signal QN (i.e. the connection point between the drain of the sixth P-type transistor switch P6 and the drain of the fourth N-type transistor switch N4), and the source thereof is coupled to the fourth common level VCCL. The gate of the sixth P-type transistor switch P6 is coupled to the first output signal Q (i.e. the connection point between the drain of the fifth P-type transistor switch P5 and the drain of the third N-type transistor switch N3), and the source thereof is coupled to the fourth common level VCCL. The initial resistor ROD is coupled to the connection point between the drain of the fifth P-type transistor switch P5 and the drain of the third N-type transistor switch N3 and is coupled to the third common level VSSL to set an initial state of the output unit 130. The output unit 130 generates the first output signal Q and the second output signal QN, of which the phases are opposite, according to the first output trigger signal VM1 and the second output trigger signal VM2 generated by the first output trigger unit 120S and the second output trigger unit 120R. Since the output unit 130 is coupled between the third common level VSSL and the fourth common level VCCL, the levels of the first output signal Q and the second output signal QN are between the third common level VSSL and the fourth common level VCCL.

Generally speaking, the first input signal VHS and the second input signal VHR have opposite phases. In order to reduce the power loss caused by the transistor switches of the first input element and the second input element switching, the first input signal VHS can be a pulse signal, and the second input signal VHR is another pulse signal with a 180° phase difference from the phase of the first input signal VHS.

Figure 3A:
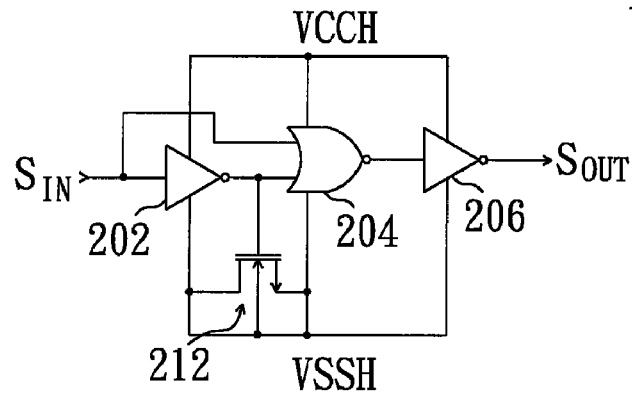
FIG. 3A is a schematic circuit diagram of a pulse generator according to one exemplary embodiment of the present invention.

Please refer to FIG. 3A which is a schematic circuit diagram of a pulse generator according to one exemplary embodiment of the present invention. The pulse generator is used to convert an input signal with a more pulse-width (e.g., 50% duty cycle) to a pulse signal (i.e. a signal with less pulse-width), so that the period during which the transistor switches of the first input element and the second input element are in the conductive state is shortened, and the power loss is reduced. Since the transistors serving as input terminal transistors in the signal transformer 100 as shown in FIG. 2 are P-type transistors, while the level of the input signal is low, the P-type transistors are conducted. Accordingly, the pulse width discussed in the present embodiment refers to the period during which the level the input signal is low. The pulse generator 200 which includes a first inverter 202, an NOR gate 204, a second inverter 206, and a transistor 212 is coupled to the first common level VCCH and the second common level VSSH. The first inverter 202 receives an input signal $S_{IN}$ and outputs it inversely to the NOR gate 204. The gate of the transistor 212 is coupled to the output terminal of the first inverter 202, and the base, the drain, and the source thereof are all coupled to the second common level VSSH, so that the transistor 212 acts as a capacitor. Accordingly, in the pulse generator 200, the transistor 212 can also be replaced with a capacitor 214 as in the pulse generator 200' of the second embodiment shown in FIG. 3B. The NOR gate 204 receives the input signal $S_{IN}$ and the signal outputted from the first inverter 202, and outputs the signal to the second inverter 206 after the NOR operation. The second inverter 206 inverts the signal outputted from the NOR gate 204, and outputs the output signal $S_{OUT}$. Please refer to FIG. 3C which shows signal waveforms of the pulse generator depicted in FIG. 3A as well as FIG. 3B. The pulse generator 200 is adapted to detect the falling edge of a signal. While the input signal $S_{IN}$ is converted from a high level to a low level, the pulse generator 200 is triggered and generates a pulse signal with a pulse width TD as the output signal $S_{OUT}$, wherein the pulse width TD is determined upon the equivalent capacitance of the transistor 212 and the driving capability of the first inverter 202. The pulse width TD can be regulated by adjusting the equivalent capacitance of the transistor 212 and the driving capability of the first inverter 202.

Figure 3B:
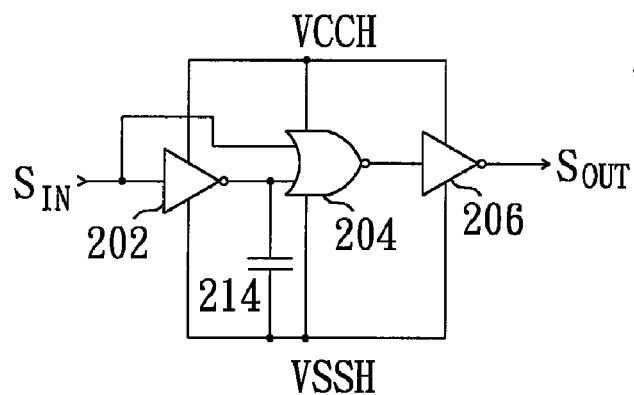
FIG. 3B is a schematic circuit diagram of a pulse generator according to another exemplary embodiment of the present invention.
Figure 3C:
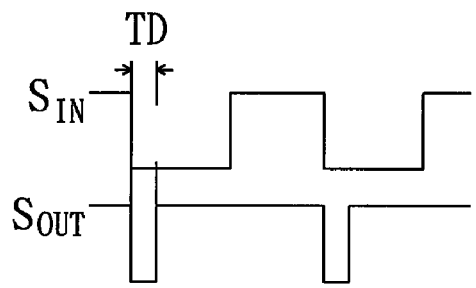
FIG. 3C shows signal waveforms of the pulse generator depicted in FIG. 3A and FIG. 3B.
Figure 4:
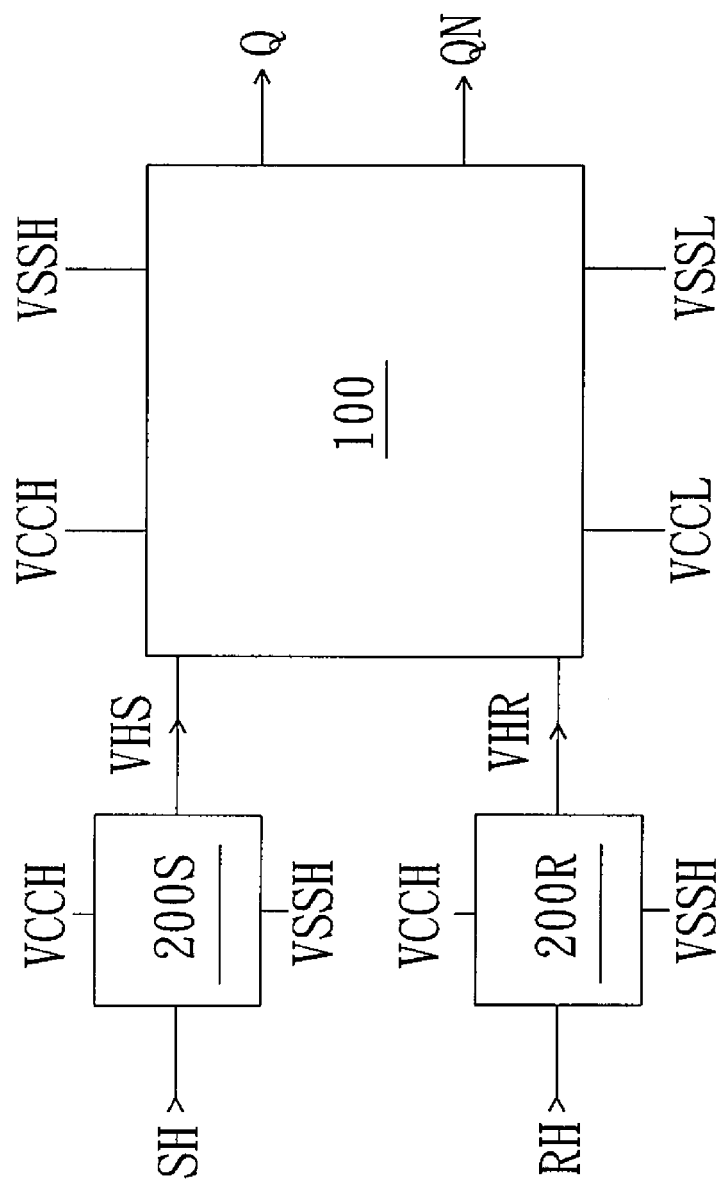
FIG. 4 is a schematic circuit diagram of a signal transformer according to another exemplary embodiment of the present invention.

Please refer to FIG. 4 which is a schematic circuit diagram of a signal transformer according to another exemplary embodiment of the present invention. In FIG. 4, the two pulse generators 200S and 200R as shown in FIG. 3A or FIG. 3B and the signal transformer 100 as shown in FIG. 2 are included. The pulse generators 200S and 200R are coupled to the first common level VCCH and the second common level VSSH, and the signal transformer 100 is coupled to the first common level VCCH, the second common level VSSH, the third common level VSSL, and the fourth common level VCCL, wherein the first common level VCCH is higher than the third common level VSSL, and the second common level VSSH is higher than the fourth common level VCCL. The pulse generators 200S and 200R respectively receive two input signals SH and RH with opposite phases, and the levels of the two input signals SH and RH are between the first common level VCCH and the second common level VSSH, wherein the input signal RH can be generated by inverting the input signal SH through an inverter. The pulse generators 200S and 200R respectively generate the signals VHS and VHR, which are pulses, according to the received input signals SH and RH, and output the signals VHS and VHR to the signal transformer 100. The signal transformer 100 generates two output signals Q and QN with opposite phases, of which the levels are between the third common level VSSL and the fourth common level VCCL, according to the input signals VHS and VHR.

Figure 5A:
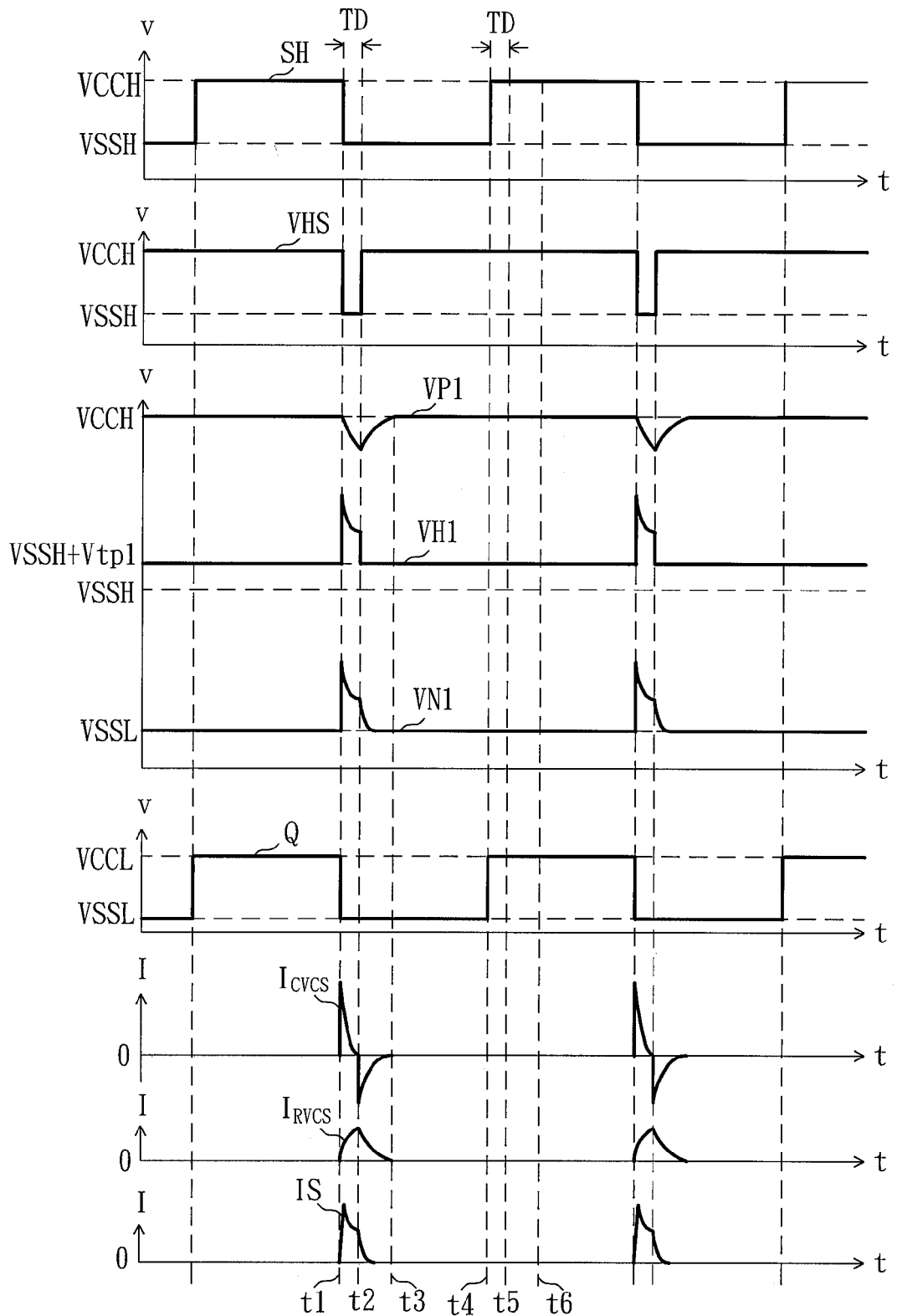
FIG. 5A and FIG. 5B are signal waveforms of the signal transformer and the pulse generator shown in FIG. 4.
Figure 5B:
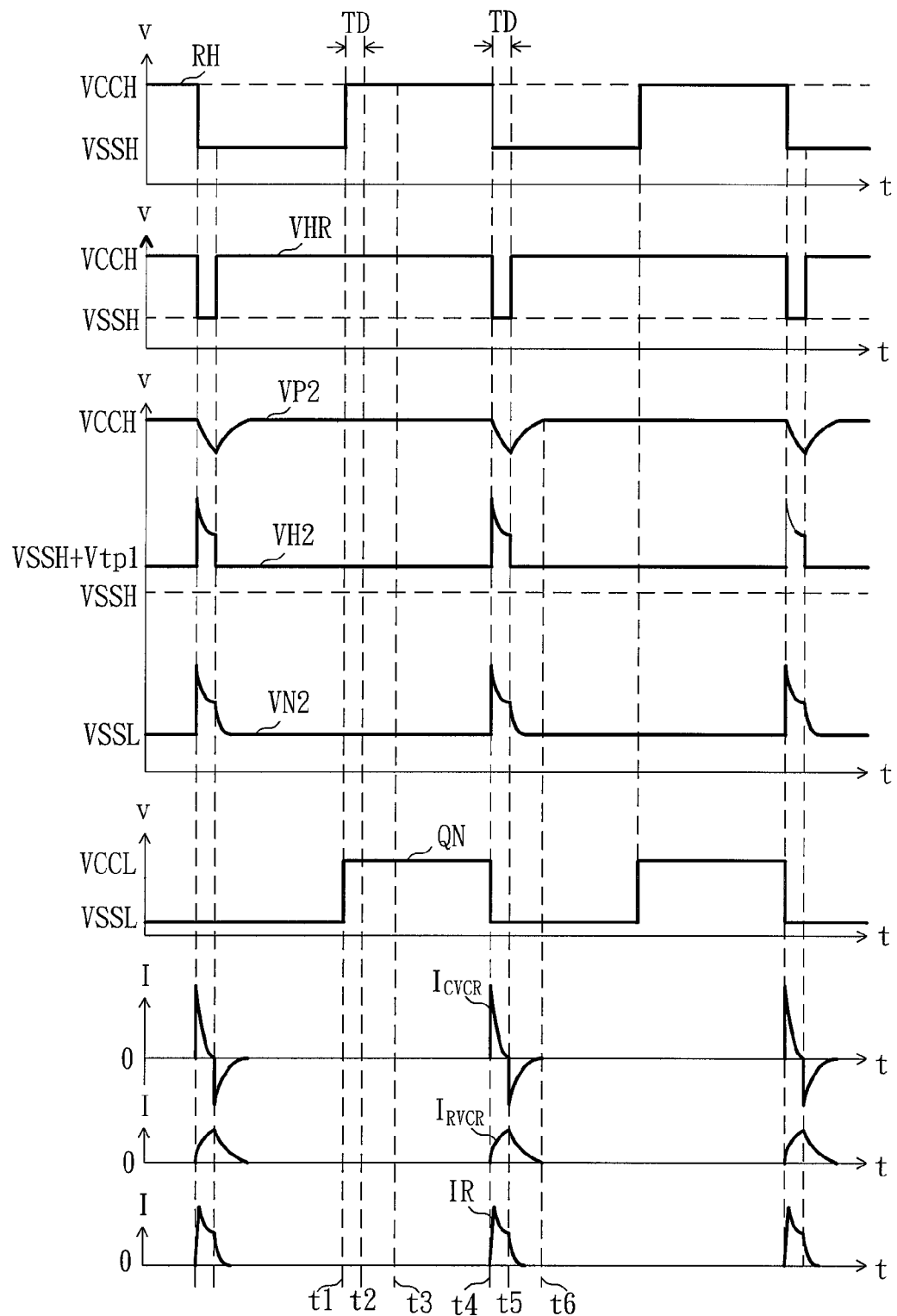

In order to detail the operation of the signal transformer of the application, please refer to FIG. 5A and FIG. 5B which are signal waveforms of the signal transformer and the pulse generators shown in FIG. 4. The operational relationship among each of the elements is further described by referring to the timing relationship among the signals.

Referring to FIG. 2, FIG. 3A, FIG. 4 and FIG. 5A, at the time t1, the high input signal SH which is converted from the high level VCCH to the low level VSSH triggers the pulse generator 200S, so that the pulse generator 200S generates a first input signal VHS having the pulse width TD. Meanwhile, the first P-type transistor switch P2 changes from cut-off to conductive, and the drain potential VH1 of the first P-type transistor switch P2 is raised from the potential (VSSH+ $V_{tp1}$), wherein $V_{tp1}$ ($V_{tp1}>0$) is a threshold voltage of the first P-type transistor switch P2. According to the function of $$I = C\frac{dV}{dt},$$

the current I of the first current capacitor CVCS is proportional to the differential voltage $$\frac{dV}{dt},$$

so that the first current capacitor CVCS provides a quite large first differential current $I_{CVCS}$. By providing the first differential current $I_{CVCS}$, the drain potential VH1 of the first P-type transistor switch P2 is raised rapidly, so that the second P-type transistor switch P1 also changes from cut-off to conductive instantly, and the first trigger signal VN1 is raised rapidly from the third common level VSSL. Due to the first current capacitor CVCS, the first current generating signal VP1 gradually falls from the first common level VCCH between the time t1 and the time t2 while the electric charges stored in the first current capacitor CVCS are released. The first differential current $I_{CVCS}$, which is generated by the first current capacitor CVCS discharging the stored electric charges, is gradually decreased. Meanwhile, the potential difference between the level of the first current generating signal VP1 and the first common level VCCH is gradually increased, so that a resistive current $I_{RVCS}$ flowing through the first current resistor RVCS is gradually increased. A current IS flowing through the second P-type transistor switch P1 is a sum of the first differential current $I_{CVCS}$ and the first resistive current $I_{RVCS}$. Between the time t1 and the time t2, the voltage of the first output trigger signal VM1 (the same as the first trigger signal VN1 in the embodiment) is increased higher than the threshold voltage of the third N-type transistor switch N3, so that the third N-type transistor switch N3 is conducted and mirrored the differential current to generate the first output signal Q at the low level, and so the sixth P-type transistor switch P6 is conducted to generate the second output signal QN at the high level.

At the time t2, the first input signal VHS is converted from the low level to the high level, so that the first P-type transistor switch P2 is cut-off, the source potential of the second P-type transistor switch P1 instantly falls to the potential (VSSH+ $V_{tp1}$), and the voltage difference between the gate and the source thereof is maintained around the threshold voltage $V_{tp1}$. The first current capacitor CVCS is charged with the first differential current $I_{CVCS}$ through the first current resistor RVCS, so that the potential difference between the level of the first current generating signal VP1 and the first common level VCCH is gradually reduced. Meanwhile, as the potential difference between the level of the first current generating signal VP1 and the first common level VCCH gradually becomes small, the resistive current $I_{RVCS}$ flowing through the first current resistor RVCS gradually becomes small. The charges of parasitic capacitors of the first N-type transistor switch N1 are released through the first resistor RPULD1 until that levels of the first trigger signal VN1 and the first output trigger signal VM1 are equal to the third common level VSSL. At this time, the third N-type transistor switch N3 is cut-off. Since the initial resistor ROD is coupled to the drain of the third N-type transistor switch N3 and the third common level VSSL, the first output signal Q is maintained at the low level, so that the sixth P-type transistor switch P6 is maintained to be conducted, and the second output signal QN is maintained at the high level. At the time t3, the first current capacitor CVCS has been charged completely, and the first current generating signal VP1 stays at the first common level VCCH. Accordingly, the current IS flowing through the second P-type transistor switch P1 is reduced to zero, so that the power is no longer consumed.

Referring to FIG. 5B, since the pulse generator 200R is triggered at a falling edge of the input signal RH, during the period between the time t1 and the time t3, the second input signal VHR is maintained at the high level, the second trigger signal VN2 and the second output trigger signal VM2 are maintained at the low level, the fourth N-type transistor switch N4 is maintained in the cut-off state, and the second output signal QN is maintained at the high level. At the time t4, the high input signal RH, which is converted from the high level VCCH to the low level VSSH, triggers the pulse generator 200R, so that the pulse generator 200R generates a second input signal VHR having the pulse width TD. Meanwhile, the third P-type transistor switch P4 changes from cut-off to conductive, and the drain potential VH2 of the third P-type transistor switch P4 is raised from the potential (VSSH+$V_{tp1}$), wherein $V_{tp1}$ is a threshold voltage of the third P-type transistor switch P4. The second current capacitor CVCR provides a quite large second differential current $I_{CVCR}$. By providing the second differential current $I_{CVCR}$, the drain potential VH2 of the third P-type transistor switch P4 is raised rapidly, so that the fourth P-type transistor switch P3 also changes from cut-off to conductive instantly, and the second trigger signal VN2 is raised rapidly from the third common level VSSL. Due to the second current capacitor CVCR, the second current generating signal VP2 gradually falls from the first common level VCCH between the time t4 and the time t5 while the electric charges stored in the second current generating signal VP2 are released. The second differential current $I_{CVCR}$ which is generated by the second current capacitor CVCR discharging the electric charges gradually becomes small. Meanwhile, the potential difference between the level of the second current generating signal VP2 and the first common level VCCH gradually becomes large, so that a resistive current $I_{RVCR}$ flowing through the second current resistor RVCR gradually becomes large. A current IR flowing through the fourth P-type transistor switch P3 is a sum of the second differential current $I_{CVCR}$ and the second resistive current $I_{RVCR}$. Between the time t4 and the time t5, the second output trigger signal VM2 (the same as the second trigger signal VN2 in the embodiment) is increased higher than the threshold voltage of the fourth N-type transistor switch N4, so that the fourth N-type transistor switch N4 is conducted to generate the second output signal QN at the low level, and so the fifth P-type transistor switch P5 is conducted to generate the first output signal Q at the high level.

At the time t5, the second input signal VHR is converted from the low level to the high level, so that the third P-type transistor switch P4 is cut-off, the source potential of the fourth P-type transistor switch P3 instantly falls to the potential (VSSH+$V_{tp1}$), and the voltage difference between the gate and the source thereof is maintained around the threshold voltage $V_{tp1}$. The second current capacitor CVCR is charged with the second differential current $I_{CVCR}$ through the second current resistor RVCR, so that the potential difference between the level of the second current generating signal VP2 and the first common level VCCH gradually becomes small. Meanwhile, as the potential difference between the level of the second current generating signal VP2 and the first common level VCCH gradually becomes small, the resistive current $I_{RVCR}$ flowing through the second current resistor RVCR gradually becomes small. The electric charges of the parasitic capacitors of the second N-type transistor switch N2 are released through the second resistor RPULD2 until that the second output trigger signal VM2 is equal to the low level of the third common level VSSL. At this time, the fourth N-type transistor switch N4 is cut-off. Meanwhile, the second output signal QN is maintained at the low level, so that the fifth P-type transistor switch P5 is maintained to be conducted, and the first output signal Q is maintained at the high level. At the time t6, the second current capacitor CVCR has been charged completely, and the second current generating signal VP2 stays at the first common level VCCH. Accordingly, the current IR flowing through the fourth P-type transistor switch P3 is reduced to zero, so that the power is no longer consumed.

Besides, since the voltage differences between the drain and the source of the second P-type transistor switch P1 and between the drain and the source of the fourth P-type transistor switch P3 may achieve the maximum voltage difference (VCCH−VSSL), compared with the first P-type transistor switch P2, the third P-type transistor switch P4, the second P-type transistor switch P1 and the fourth P-type transistor switch P3 need to have higher withstand voltage.

The first current generating unit 105S of the signal transformer 100 shown in FIG. 2 is coupled between the first common level VCCH and the first input unit 125S, and the second current generating unit 105R is coupled between the first common level VCCH and the second input unit 125R. In practice, the operation of the circuit is not affected by exchanging the first current generating unit 105S with the first P-type transistor switch P2 in the first input unit 125S and exchanging the second current generating unit 105R with the third P-type transistor switch P4 in the second input unit 125R. Besides, the first current resistor RVCS in the first current generating unit 105S and the second current resistor RVCR in the second current generating unit 105R serve to provide a basic current for operating the circuit and to provide charging current to the lower plates of the first current capacitor CVCS and the second current capacitor CVCR, so that the first current resistor RVCS and the second current resistor RVCR can be replaced by a current source, which does not affect the operation of the circuit.

Figure 6:
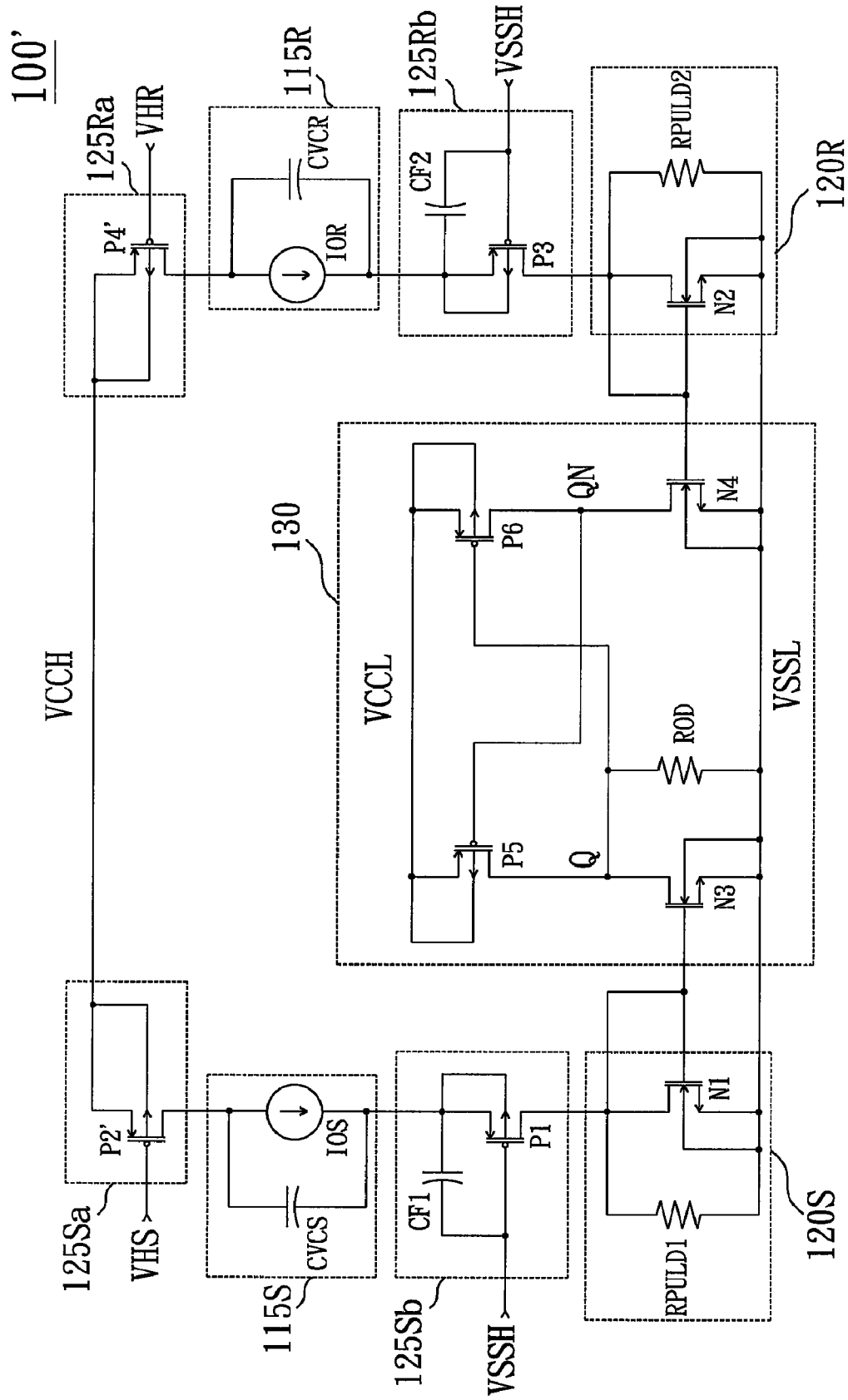
FIG. 6 is a schematic circuit diagram of a signal transformer according to another exemplary embodiment of the present invention.

Please refer to FIG. 6 which is a schematic circuit diagram of a signal transformer according to another exemplary embodiment of the present invention. Compared with the signal transformer 100 shown in FIG. 2, the first input unit 125S in the signal transformer 100' of the present embodiment is divided into two parts, i.e. a first input portion 125Sa and a first voltage clamp portion 125Sb. The first input portion 125Sa is used to receive the first input signal VHS. The first voltage clamp portion 125Sb receives the second common level VSSH for clamping the voltage range of the circuit in the first input unit 125S. The second input unit 125R is also divided into two parts, i.e. a second input portion 125Ra and a second voltage clamp portion 125Rb. The position of a first current generating unit 115S is exchanged with the position of a first P-type transistor switch P2' serving as the first input portion 125Sa in the first input unit 125S, and the position of a second current generating unit 115R is exchanged with the position of a third P-type transistor switch P4' serving as the second input portion 125Ra in the second input unit 125R. Additionally, in the first current generating unit 115S, the first current resistor RVCS is replaced with a first current source IOS; in the second current generating unit 115R, the second current resistor RVCR is replaced with a second current source IOR.

Besides the connection relationship of the above-described circuit and the replacement of the elements with equivalent elements, other operational relationships of the circuit are the same as the operational relationship of the signal transformer 100 shown in FIG. 2, and therefore further descriptions are omitted herein.

According to the above-described embodiments, the level of input signal can be shifted from high to low to meet the applicable range of the back-end circuit, so that the level of the input signal generated from the front-end circuit can be prevented from being higher than the applicable range of the back-end circuit. Of course, the present invention can also be applied to a low-to-high signal transformer to deal with a situation that the level of the input signal generated from the front-end circuit is lower than the applicable range of the back-end circuit.

Figure 7:
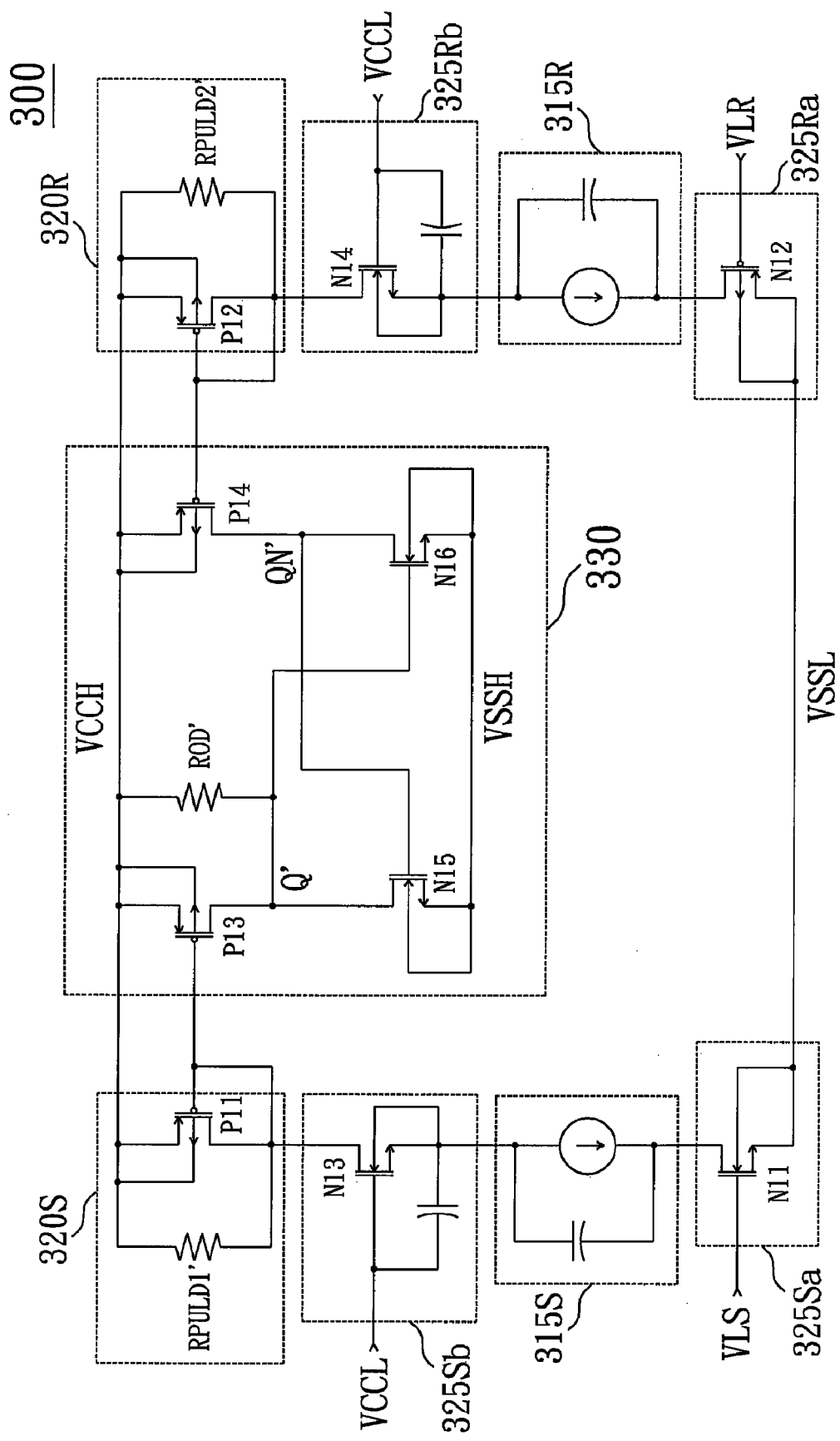
FIG. 7 is a schematic circuit diagram of a signal transformer according to another exemplary embodiment of the present invention.

Please refer to FIG. 7 which is a schematic circuit diagram of a signal transformer according to another exemplary embodiment of the present invention. The signal transformer 300 of the present embodiment is used to output an input signal with a low-to-high level shifting, and the signal transformer 300 includes a first input element, a second input element, and an output unit 330. The first input element and the second input element are coupled to a first common level VCCH and a third common level VSSL, and the output unit 330 is coupled to the first common level VCCH and the second common level VSSH. The first input element includes a first input unit, a first output trigger unit 320S, and a first current generating unit 315S, wherein the first input unit is divided into two parts, i.e. a first input portion 325Sa and a first voltage clamp portion 325Sb. The second input element includes a second input unit, a second output trigger unit 320R, and a second current generating unit 315R, wherein the second input unit is divided into two parts, i.e. a second input portion 325Ra and a second voltage clamp portion 325Rb.

The first input portion 325Sa of the first input unit and the second input portion 325Ra of the second input unit are coupled to the third common level VSSL, and the first voltage clamp portion 325Sb of the first input unit and the second voltage clamp portion 325Rb of the second input unit are coupled to the fourth common level VCCL. The first input portion 325Sa includes an N-type transistor switch N11, and the first voltage clamp portion 325Sb includes an N-type transistor switch N13 and a capacitor coupled to the gate and the source of the N-type transistor switch N13. The N-type transistor switch N11 is used to receive a first input signal VLS, the gate of the N-type transistor switch N13 is coupled to the fourth common level VCCL, and the capacitor coupled to the N-type transistor switch N13 is used to filter out high-frequency noises in the first input unit. The second input portion 325Ra includes an N-type transistor switch N12, and the second voltage clamp portion 325Rb includes an N-type transistor switch N14 and a capacitor coupled to the gate and the source of the N-type transistor switch N14. The N-type transistor switch N12 is used to receive a second input signal VLR, the gate of the N-type transistor switch N14 is coupled to the fourth common level VCCL, and the capacitor coupled to the N-type transistor switch N14 is used to filter out high-frequency noises in the second input unit. Here, the levels of the first input signal VLS and the second input signal VLR are between the fourth common level VCCL and the third common level VSSL.

The first output trigger unit 320S and the second output trigger unit 320R are coupled to the first common level VCCH and respectively coupled to the first voltage clamp portion 325Sb of the first input unit and the second voltage clamp portion 325Rb of the second input unit. The first output trigger unit 320S includes a resistor RPULD1' and a P-type transistor switch P11 which are connected in parallel. The drain of the P-type transistor switch P11 is coupled to the first voltage clamp portion 325Sb of the first input unit, and the gate thereof is coupled to the output unit 330. The resistor RPULD1' is coupled to the drain and the source of the P-type transistor switch P11. The second output trigger unit 320R includes a resistor RPULD2' and a P-type transistor switch P12 which are connected in parallel. The drain of the P-type transistor switch P12 is coupled to the second voltage clamp portion 325Rb of the second input unit, the gate thereof is coupled to the output unit 330, and the source thereof is coupled to the first common level VCCH. The resistor RPULD2' is coupled to the drain and the source of the P-type transistor switch P12. Through the resistor RPULD1' and the resistor RPULD2', the drains of the P-type transistor switches P11 and P12 can be avoided to be in a floating state while the P-type transistor switches P11 and P12 are cut-off, so that possible errors of the circuit are avoided.

The first current generating unit 315S and the second current generating unit 315R are respectively coupled to the first input unit and the second input unit, and are coupled to the first output trigger unit 320S and the second output trigger unit 320R through the first voltage clamp portion 325Sb of the first input unit and the second voltage clamp portion 325Rb of the second input unit. The first current generating unit 315S and the second current generating unit 315R respectively include a capacitor and a current source which are connected in parallel, wherein the capacitor serves as a fast current generating element. While the transistor switches in the first and the second input elements are switched, the capacitors provide sufficient instant currents to shorten a transient response time. The transient response time can also be adjusted by regulating the capacitance of the capacitor and an amount of the current from the current source.

The output unit 330 includes a resistor ROD' and two sets of transistor switches, i.e. the P-type transistor switch P13 and the N-type transistor switch N15 which are connected in series and the P-type transistor switch P14 and the N-type transistor switch N16 which are connected in series. The connection point between the serially connected N-type transistor switch and the P-type transistor switch of each set is coupled to the gate of the N-type transistor switch of the other set, and the resistor ROD' is in parallel connected to one of the P-type transistor switches in the two sets. The gates of the P-type transistor switches P13 and P14 are respectively coupled to the gate of the P-type transistor switch P11 in the first output trigger unit 320S and the gate of the P-type transistor switch P12 in the second output trigger unit 320R. A first output signal Q' is output from the connection point between the N-type transistor switch N15 and the P-type transistor switch P13, and a second output signal QN' is output from the connection point between the N-type transistor switch N16 and the P-type transistor switch P14. Since the output unit 330 is coupled between the first common level VCCH and the second common level VSSH, the levels of the first output signal Q' and the second output signal QN' are between the first common level VCCH and the second common level VSSH.

Through the signal transformer shown in FIG. 7, the levels of the first input signal VLS and the second input signal VLR between the third common level VSSL and the fourth common level VCCL are raised and become the levels of the first output signal Q' and the second output signal QN' between the first common level VCCH and the second common level VSSH, and then the first output signal Q' and the second output signal QN' are output.

Figure 8A:
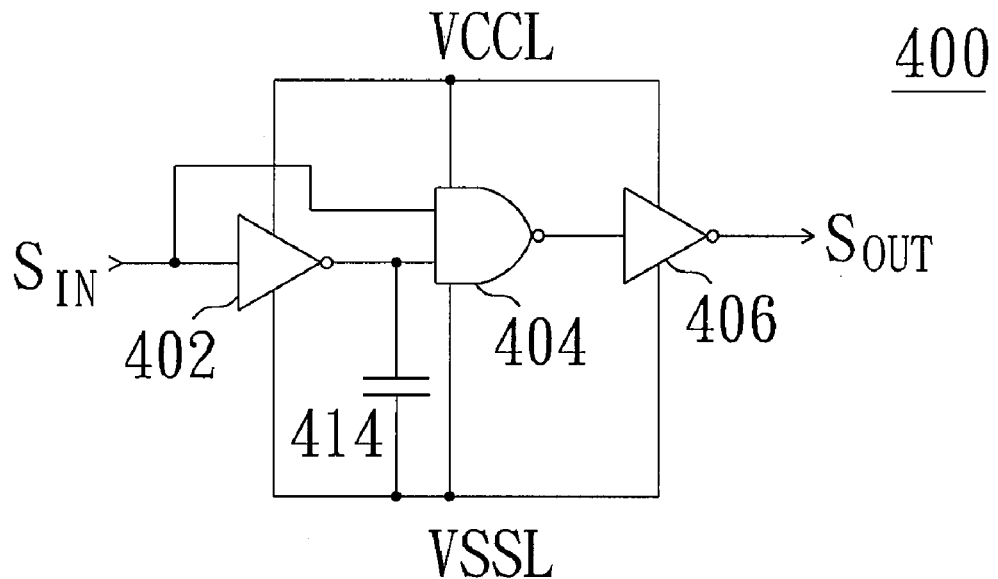
FIG. 8A is a schematic circuit diagram of a pulse generator capable of being applied to the signal transformer shown in FIG. 7.
Figure 8B:
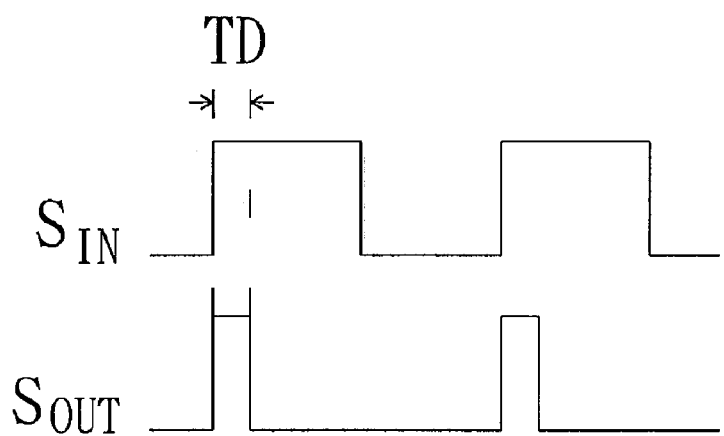
FIG. 8B shows signal waveforms of the pulse generator depicted in FIG. 8A.

In order to reduce the power loss caused by the turned-on transistor switches of the first input element and the second input element, the first input signal VLS and the second input signal VLR can become pulse signals processed by a pulse generator shown in FIG. 8A to reduce the power loss in the circuit. Please refer to FIG. 8A which is a schematic circuit diagram of a pulse generator capable of being applied to the signal transformer shown in FIG. 7. The pulse generator 400, including a first inverter 402, a NAND gate 404, a second inverter 406, and a capacitor 414, is coupled to the fourth common level VCCL and the third common level VSSL. The first inverter 402 receives an input signal $S_{IN}$ and outputs it inversely to the NAND gate 404. The capacitor 414 is coupled between an output terminal of the first inverter 402 and the third common level VSSL. The NAND gate 404 receives the input signal $S_{IN}$ and the signal outputted from the first inverter 402, and outputs to the second inverter 406 after NAND operation. The second inverter 406 inverts the signal output from the NAND gate 404 and outputs the output signal $S_{OUT}$. Please refer to FIG. 8B which shows signal waveforms of the pulse generator as shown in FIG. 8A. The pulse generator 400 detects the rising edge of a signal. While the input signal $S_{IN}$ is converted from a low level to a high level, the pulse generator 400 is triggered to generate a pulse signal with a pulse width TD as the output signal $S_{OUT}$, wherein the pulse width TD is determined upon the capacitor 414 and the driving capability of the first inverter 402. The width of the pulse width TD can be regulated by adjusting the capacitance of the capacitor 414 and the driving capability of the first inverter 402.

To sum up, in the embodiments of the present invention, a fast current generating element is used to provide a large current for accelerating the switching rate of the transistor switches to shorten the switching time. The fast current generating element may include a capacitor to provide a large differential current when the voltage level is changed by switching the transistor switches. Therefore, according to the embodiments of the present invention, the issue with respect to the excessive transient response time of a conventional signal transformer can be resolved.

As the above description, the present application completely complies with the patentability requirements: novelty, non-obviousness, and utility. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A signal transformer, used to transform a level of signal, the signal transformer comprising:
    two input elements, each of the input elements comprising:
        an input unit coupled to a first common level and a second common level and receiving an input signal so as to generate a current generating signal and a trigger signal, wherein a level of the input signal is between the first common level and the second common level;
        an output trigger unit coupled to a third common level and the input unit and generating an output trigger signal according to the trigger signal; and
        a current generating unit coupled to the input unit and the output trigger unit and comprising a fast current generating element, the fast current generating element generating a current pulse signal according to the current generating signal so as to shorten a transient response time of the output trigger signal generated by the output trigger unit; and
    an output unit coupled to the third common level and a fourth common level and generating two output signals with opposite phases according to the two output trigger signals of the two output trigger units, wherein levels of the two output signals are between the third common level and the fourth common level.

2. The signal transformer as claimed in claim 1, wherein each of the fast current generating elements comprises a capacitor coupled to one of the first common level and the second common level and coupled to the corresponding input unit.

3. The signal transformer as claimed in claim 2, wherein each of the current generating units further comprises a resistor, and the resistor is coupled to one of the first common level and the second common level and coupled to the corresponding input unit.

4. The signal transformer as claimed in claim 2, wherein each of the current generating units further comprises a current source used to provide a basic current signal.

5. The signal transformer as claimed in claim 2, wherein each of the input units comprises a first first-type transistor switch and a second first-type transistor switch connected in series, a gate of the first first-type transistor switch receives the corresponding input signal, and the second first-type transistor switch is coupled to the output trigger unit.

6. The signal transformer as claimed in claim 5, wherein a filter capacitor is coupled between a source and a gate of the second first-type transistor switch so as to filter out high-frequency noises.

7. The signal transformer as claimed in claim 2, wherein each of the output trigger units comprises a resistor and a second-type transistor switch connected in parallel.

8. The signal transformer as claimed in claim 2, wherein the output unit comprises a resistor and two sets of a first-type transistor switch and a second-type transistor switch connected in series, and a connection point of one of the two sets of the serially connected first-type transistor switch and second-type transistor switch is coupled to a gate of the first-type transistor switch of the other set, and the resistor and one of the second-type transistor switches are connected in parallel.

9. The signal transformer as claimed in claim 1, further comprising:
    two pulse generators receiving two pre-input signals with opposite phases respectively and detecting a rising edge or a falling edge of the pre-input signals so as to generate the two input signals.

10. The signal transformer as claimed in claim 9, wherein each of the pulse generators comprises a first inverter, an NOR gate, a second inverter, and a first capacitor, an input terminal of the first inverter receives the corresponding pre-input signal, an output terminal of the first inverter is coupled to the first capacitor, the NOR gate is coupled to the corresponding pre-input signal and the output terminal of the first inverter, and an input terminal of the second inverter is coupled to an output terminal of the NOR gate and outputs the input signal.

11. The signal transformer as claimed in claim 9, wherein each of the pulse generators comprises a third inverter, an NAND gate, a fourth inverter, and a second capacitor, an input terminal of the third inverter receives the corresponding pre-input signal, an output terminal of the third inverter is coupled to the second capacitor, the NAND gate is coupled to the corresponding pre-input signal and the output terminal of the third inverter, and an input terminal of the fourth inverter is coupled to an output terminal of the NAND gate and outputs the input signal.

* * * * *